United States Patent
Sharma et al.

(10) Patent No.: US 9,791,496 B2
(45) Date of Patent: Oct. 17, 2017

(54) SYSTEM AND METHOD FOR DETECTING, LOCALIZING AND QUANTIFYING EXCESS VOLTAGE DROP IN THREE-PHASE AC CIRCUITS

(71) Applicant: Eaton Corporation, Cleveland, OH (US)

(72) Inventors: Santosh Kumar Sharma, Viman Nagar (IN); Rahul Choudhary, Kharadi (IN); Xin Zhou, Wexford, PA (US); Steven Andrew Dimino, Wauwatosa, WI (US)

(73) Assignee: Eaton Corporation, Cleveland, OH (US)

( * ) Notice: Subject to any disclaimer, the term of this patent is extended or adjusted under 35 U.S.C. 154(b) by 714 days.

(21) Appl. No.: 14/230,238

(22) Filed: Mar. 31, 2014

(65) Prior Publication Data

US 2015/0276827 A1   Oct. 1, 2015

(51) Int. Cl.
*G01R 31/08*       (2006.01)
*H02H 3/253*       (2006.01)
(Continued)

(52) U.S. Cl.
CPC .......... *G01R 31/086* (2013.01); *H02H 3/253* (2013.01); *G01R 31/088* (2013.01); *H02H 3/382* (2013.01);
(Continued)

(58) Field of Classification Search
CPC .. G01R 31/088; G01R 31/343; G01R 31/024; G01R 31/026; G01R 31/086;
(Continued)

(56) References Cited

U.S. PATENT DOCUMENTS 8,963,556 B2 *  2/2015  Sharma ............... G01R 31/024
                                                  324/509
2005/0231871 A1  10/2005  Ghartemani
(Continued)

FOREIGN PATENT DOCUMENTS

GB         858638 A     1/1961
GB        2362275 A    11/2001
(Continued)

OTHER PUBLICATIONS

Wang, "An Analytical Study on Steady-state Performance of an Induction Motor Connected to Unbalanced Three-phase Voltage," Dept. of Electr. Eng., Nat. Yun-Lin Univ. of Sci. & Technol., Taiwan, Power Engineering Society Winter Meeting, 2000, IEEE, pp. 159-164.

(Continued)

*Primary Examiner* — Vinh Nguyen
(74) *Attorney, Agent, or Firm* — Ziolkowski Patent Solutions Group, SC (57) ABSTRACT

A system and method for detecting and localizing excess voltage drop in single or multiple phases of three-phase AC circuits is disclosed. An electrical distribution circuit is provided that includes an input connectable to an AC source, an output connectable to terminals of an electrical machine, the output configured to provide three-phase voltages and currents to the electrical machine, and a diagnostic system configured to detect an excess voltage drop (EVD) in the electrical distribution circuit. The diagnostic system includes a processor that is programmed to receive measurements of the three-phase voltages and currents provided to the electrical machine, compute a negative sequence voltage from the three-phase voltages and currents, determine a localization reference phase angle for each phase based in part on the three-phase voltages and currents, and calculate an EVD in the electrical distribution circuit based (Continued)

on the negative sequence voltage and the localization reference phase angles.

20 Claims, 7 Drawing Sheets (51) Int. Cl.
*H02J 3/26* (2006.01)
*H02H 3/38* (2006.01)

(52) U.S. Cl.
CPC .............. *H02J 3/26* (2013.01); *Y02E 40/50* (2013.01); *Y04S 10/522* (2013.01)

(58) Field of Classification Search
CPC .... G01R 19/0046; G01R 31/346; H02H 3/44; H02H 5/10; H02H 3/382; H02J 3/26; H02P 29/0243; H02P 2207/01; H02P 29/0241; G01N 27/9073
See application file for complete search history.

(56) References Cited

U.S. PATENT DOCUMENTS

| | | |
|---|---|---|
| 2007/0041137 A1 | 2/2007 | Thompson |
| 2010/0060289 A1 | 3/2010 | Wiedenbrug et al. |
| 2011/0134669 A1 | 6/2011 | Yuzurihara et al. |

FOREIGN PATENT DOCUMENTS

| | | |
|---|---|---|
| KR | 905443 B1 | 5/2007 |
| KR | 925148 | 11/2007 |
| KR | 2011096828 | 2/2010 |

OTHER PUBLICATIONS

Al-Diab et al., "Unbalanced Voltage Drops Compensations Using Flywheel Energy Storage System," 2011 11th International Conference on Electrical Power Quality and Utilisation (EPQU), Res. Group for Power Syst. Technol., Ruhr-Univ. Bochum, Bochum, Germany, pp. 1-6.

Chindris et al., "Propagation of Unbalance in Electric Power Systems," 9th International Conference, Electrical Power Quality and Utilisation, Barcelona, Oct. 9-11, 2007, pp. 1-5.

Yun et al., "Online Detection of High-Resistance Connections in the Incoming Electrical Circuit for Induction Motors," IEEE Transactions on Industry Applications, vol. 45, No. 2, Mar./Apr. 2009, pp. 694-702.

Yoon et al., "Automated Monitoring of High-Resistance Connections in the Electrical Distribution System of Industrial Facilities," Dept. of Electr. Eng., Korea Univ., Seoul, Industry Applications Society Annual Meeting, 2008, IAS '08, IEEE, pp. 1-8.

Yun et al., "Detection and Classification of Stator Turn Faults and High-Resistance Electrical Connections for Induction Machines," IEEE Transactions on Industry Applications, vol. 45, No. 2, Mar./Apr. 2009, pp. 666-675.

Wu et al., "Improved Online Condition Monitoring Using Static Eccentricity-Induced Negative Sequence Current Information in Induction Machines," Sch. of Electr. & Comput. Eng., Georgia Inst. of Technol., Atlanta, GA, USA, 31st Annual Conference of IEEE Industrial Electronics Society, 2005, IECON 2005, pp. 1737-1742.

* cited by examiner

SYSTEM AND METHOD FOR DETECTING, LOCALIZING AND QUANTIFYING EXCESS VOLTAGE DROP IN THREE-PHASE AC CIRCUITS

BACKGROUND OF THE INVENTION

The present invention relates generally to three-phase alternating current (AC) circuits and, more particularly, to a system and method for detecting and localizing excess voltage drop in single or multiple phases of three-phase AC circuits.

In industrial facilities, electrical machines such as generators, AC motors, and/or transformers are used in various applications. As one example, induction motors are used for applications like pumping, cooling, material movement, and other applications where cost-efficient and robust motors are required. An electrical distribution system is used in conjunction with electrical machines in such applications, with the electrical distribution system including protection and control components such as breakers, contactors, starters, etc.

In providing connections within an electrical distribution system and at the electrical machine, it is recognized that an improper connection of protection and/or control components can lead to over-heated contacts that can lead to fire, equipment damage, and process downtime and efficiency loss. That is, excess voltage drops can occur in distribution circuits when electrical connections become loose or have less wire binding force. While even good joints/connections have some level of voltage drop (e.g., in the range of 3-10 mV) that is acceptable, bad joints/connections have an excess voltage drop in the range 100-300 mV or higher. Such voltage drops can lead to abnormal power dissipation at the connections and correspondingly to over-heated contacts or hot spots in the connections that can initiate fire and equipment damage. Even at an early stage, the voltage drops lead to energy losses as line drops, in effect reducing motor efficiency and motor life for example.

Often, the problem of improper electrical connections is addressed to a certain extent by performing preventative maintenance, like annual retorquing of connections or by periodic inspection of all the electrical connections when the distribution circuit is offline. With respect to inspection of the electrical connections, such inspections are typically performed via separate dedicated sensing devices that inspect the electrical distribution system using acoustic or temperature sensing. For example, infrared (IR) scanners are often used to perform a periodic thermal inspection of the electrical distribution system. While effective, the inspection of electrical distribution system by way of such IR scanners is an intensive procedure that can be quite costly. Additionally, the inspection of an electrical distribution system by way of an IR scanner does not provide for online monitoring of the electrical connections and are limited to line-of-sight monitoring.

It would therefore be desirable to provide a system and method that detects excess voltage drops in a distribution circuit in an efficient and cost effective manner, so as to identify improper electrical connections in the circuit. It would also be desirable for such a system and method to be non-intrusive, such that the detection of excess voltage drops in a distribution circuit can be performed while the circuit is online. It would still further be desirable for such a system and method to localize a detected excess voltage drops to a particular phase or phases of the distribution circuit and quantify the excess drop.

BRIEF DESCRIPTION OF THE INVENTION

The present invention provides a system and method for detecting excess voltage drops in three-phase AC circuits.

In accordance with one aspect of the present invention, an electrical distribution circuit includes an input connectable to an AC source, an output connectable to terminals of an electrical machine, the output configured to provide three-phase voltages and currents to the electrical machine, and a diagnostic system configured to detect an excess voltage drop (EVD) in the electrical distribution circuit, the diagnostic system comprising a processor that is programmed to receive measurements of the three-phase voltages and currents provided to the electrical machine, compute a negative sequence voltage from the three-phase voltages and currents, determine a localization reference phase angle for each phase based in part on the three-phase voltages and currents, and calculate an EVD in the electrical distribution circuit based on the negative sequence voltage and the localization reference phase angles.

In accordance with another aspect of the invention, a method for detecting excess voltage drop (EVD) in an electrical distribution circuit includes measuring three-phase voltages and currents provided to an electrical machine in the electrical distribution circuit by way of voltage and current sensors and causing a diagnostic system to calculate a fault severity index (FSI) based on the measured three-phase voltages and currents, wherein causing the diagnostic system to calculate the FSI further includes receiving the measured three-phase voltages and currents provided to the terminals of the electrical machine, computing a positive, negative, and zero sequence voltage and sequence current from the three-phase voltages, determining a compensated negative sequence voltage from the negative sequence voltage component, determining a localization reference phase angle for each phase based in part on the three-phase currents, and calculating the fault severity index (FSI) in the electrical distribution circuit based on the compensated negative sequence voltage and the localization reference phase angles.

In accordance with yet another aspect of the invention, a diagnostic system configured to detect an excess voltage drop (EVD) fault in an electrical distribution circuit is provided. The diagnostic system includes a processor programmed to receive three-phase voltages and currents provided to terminals of an electrical machine connected to the electrical distribution circuit, compute positive sequence, negative sequence, and zero sequence voltage and current from the three-phase voltages and currents, determine a compensated negative sequence voltage from the negative sequence voltage component, determine a localization reference phasor for each phase based in part on the three-phase currents, identify an EVD fault in the electrical distribution circuit based on the compensated negative sequence voltage, and localize the EVD fault to one or more phases in the three-phase output based on a difference between a phase angle of the compensated negative sequence voltage and the localization reference phasors.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENTS

The embodiments of the invention set forth herein relate to a system and method for detecting and localizing excess voltage drop in single or multiple phases of three-phase AC circuits.

Figure 1:
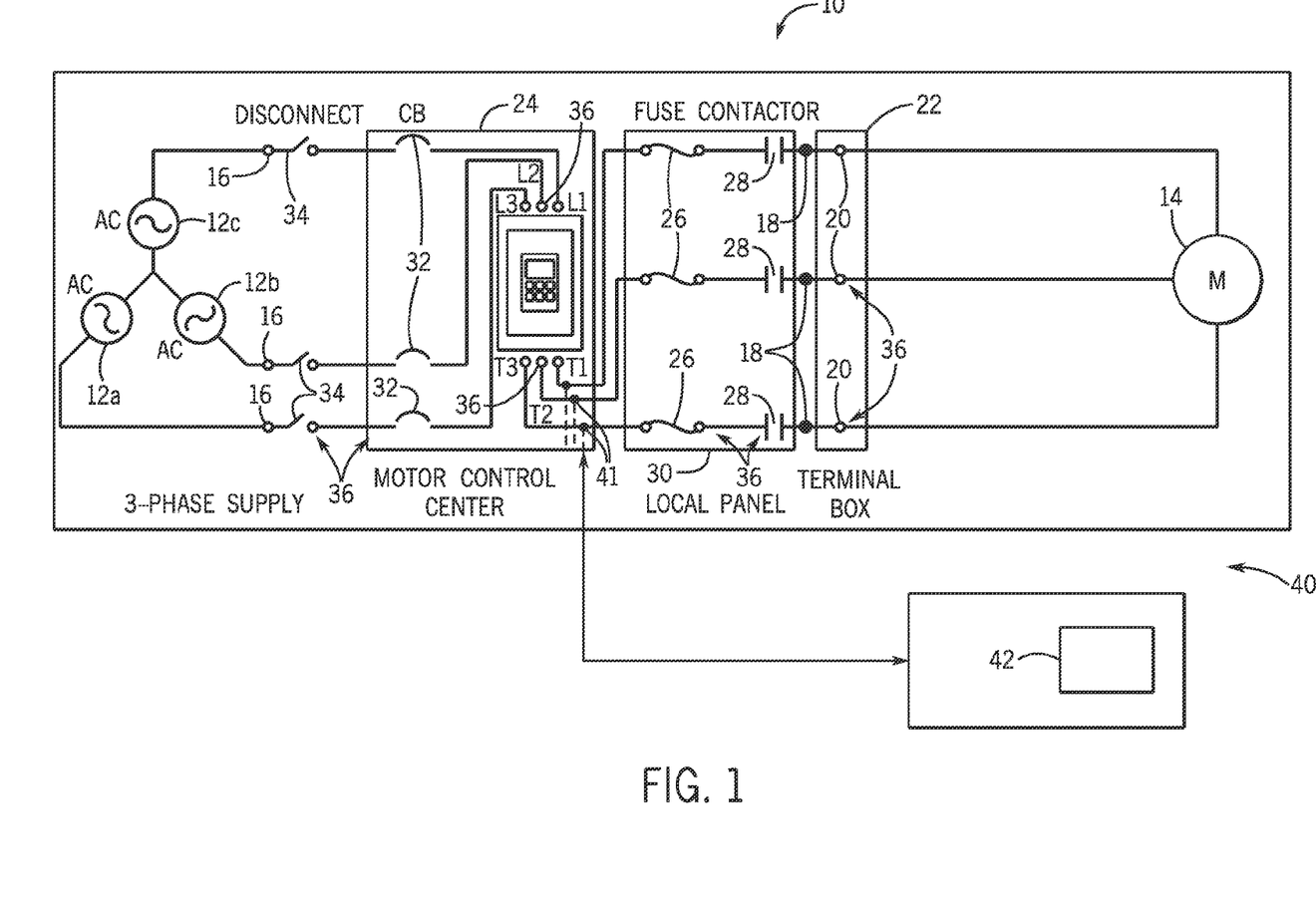
FIG. 1 is a schematic view of a three-phase electrical distribution circuit for use with embodiments of the present invention.

Referring to FIG. 1, a three-phase electrical distribution circuit 10 (or "motor circuit") is shown according to an embodiment of the invention. The electrical distribution circuit 10 is connected between a three-phase AC input 12a-12c and a load 14, such as an AC electrical machine, to provide protection to the electrical machine and to condition power from the three-phase AC input 12a-12c for delivery to the machine. According to one embodiment of the invention, the electrical machine 14 is in the form of an induction motor 14, and thus is referred to hereafter in FIG. 1 as induction motor 14. However, it is recognized that the electrical machine 14 could also be a generator or transformer, for example, or any other load that might be driven by a three-phase power and useful in an industrial setting.

The electrical distribution circuit 10 includes an input 16 that is connectable to three-phase AC input 12a-12c to receive power therefrom. The electrical distribution circuit 10 also includes a three-phase output 18 that is connectable to motor terminals 20 of the induction motor to provide three-phase voltages and currents to the induction motor 14. According to one embodiment, the output 18 can be connected to motor terminals 20 at a terminal box 22 of the electrical distribution circuit 10, for example.

As further shown in FIG. 1, a plurality of circuit components are included in electrical distribution circuit 10 that are positioned between the input 16 and the output 18—with the circuit components providing protection from and control of voltage and current that is provided from the three-phase AC input 12a-12c for delivery to the induction motor 14. A number of such protection and control components are shown in FIG. 1, but it is recognized that other components could also/instead be included in electrical distribution circuit 10 according to embodiments of the invention. In the embodiment of electrical distribution circuit 10 shown in FIG. 1, a motor control center (MCC) 24 is shown as being included in the circuit. The motor control center 24 may comprise an assembly of one or more enclosed sections having a common power bus and containing a number of motor control units—such as a number of motor starters. The motor control center 24 can also include variable frequency drives, programmable controllers, and metering. Associated with operation of the motor control center 24 are a number of protection components/devices to protect the motor 14, provide short-circuit protection, and/or isolate the motor circuit. For example, fuses 26 and contactors 28 are provided in the electrical distribution circuit 10, such as in a local electrical panel 30, to provide for short-circuit protection and control of the induction motor 14. A circuit breaker 32 and disconnect switch 34 are also provided to provide short-circuit protection and isolation of the electrical distribution circuit 10.

It is recognized that the electrical distribution circuit 10 shown in FIG. 1 is merely illustrative of a motor electrical distribution circuit that may be associated with an embodiment of the present invention, and that three-phase AC circuits of various configurations and arrangements could instead be provided according to embodiments of the invention.

With respect to the electrical distribution circuit 10 shown in FIG. 1, a plurality of electrical connections, generally referenced as 36, is made in the circuit to connect components 24, 26, 28, 32, 34 therein to one another and to the induction motor 14. In making such connections, it is recognized that an improper connection of protection and/or control components can lead to over-heated contacts that can lead to fire, equipment damage, and process downtime and efficiency loss. That is, excess voltage drops (EVD) can occur in motor circuits when electrical connections 36 become loose or have less wire binding force, with such voltage drops leading to abnormal power dissipation at the connections and correspondingly to over-heated contacts or hot spots in the connections that can initiate fire and equipment damage, energy losses as line drops, motor efficiency loss, and motor life reduction.

Accordingly, a diagnostic system 40 is included in the electrical distribution circuit 10 to detect an EVD fault in the electrical distribution circuit 10, according to an embodiment of the invention. The diagnostic system 40 receives an input regarding the three-phase voltage and current provided to the induction motor 14. According to an exemplary embodiment, the diagnostic system 40 receives voltage and current measurements acquired from voltage and current sensors integrated into a motor starter(s) in the MCC 24; however, it is recognized that separate dedicated voltage and current sensors could be included in electrical distribution circuit 10 to acquire voltage and current data and provide it to diagnostic system 40. As shown in FIG. 1, a processor 42 in the diagnostic system 40 receives the measured three-phase voltages and currents and is programmed to analyze the data to identify an EVD fault in the electrical distribution circuit 10. In identifying an EVD fault in the electrical distribution circuit 10, the processor 42 calculates a fault severity index (FSI) having a magnitude that is an indicator of the amount of EVD at a bad joint and an angle that indicates the phase which has the bad joints and the EVD therein.

While the diagnostic system 40 is shown in FIG. 1 as being in the form of a standalone product/device, it is recognized that such a system could be incorporated into a protection and control component included in the electrical distribution circuit 10. That is, a processor 42 having a program/algorithm thereon that enables detection of an EVD fault in the electrical distribution circuit 10 can reside in an existing starter, relay, drive, breaker, motor control center and/or other motor control or protection product in the electrical distribution circuit 10. The diagnostic system 40 can thus provide online monitoring of the electrical distribution circuit 10 from a location of the distribution circuit or at a location remote from the distribution circuit.

Furthermore, while embodiments of the inventors are described here below with respect to the processor 42 of diagnostic system 40 being programmed to perform a technique to identify an EVD fault in the electrical distribution circuit 10, it is recognized that the term "processor" as used herein need not be a programmable device. That is, it is to be understood that the processor 42 (and the steps performed thereby), as described hereafter, also covers equivalent hardware and computing devices that perform the same tasks.

In detecting the existence of an EVD in a three-phase motor circuit using the supply voltages and currents, it is recognized that an EVD leads to voltage unbalance or asymmetry at the motor terminals, which in turn leads to a current unbalance or flow of asymmetrical currents in the circuit. As a rule-of-thumb a 1% voltage unbalance in supply could lead to a 6-10% unbalance in motor current, such that even small voltage drops in the range of 100-300 mV could lead to appreciable current unbalance leading to its detection. This amplification of current unbalance is due to the low value of negative sequence impedance of motor circuits, and it is recognized that this amplification gets stronger as the size of the motor increases and as the negative sequence impedance decreases According to embodiments of the invention, for purposes of detecting the existence of an EVD in a three-phase motor circuit, the method of symmetrical components is employed to simplify the analysis of the motor circuit as it becomes unbalanced, either due to fault or are unbalanced already. The asymmetrical/unbalanced phasors (voltages and currents) are represented as three symmetrical sets of balanced phasors—the first set has the same phase sequence as the system under study (positive sequence, e.g., ABC), the second set has the reverse phase sequence (negative sequence, e.g., ACB), and in the third set the phasors A, B and C are in phase with each other (zero sequence). Essentially, this method converts three unbalanced phases into three independent sources, which makes asymmetric fault analysis more tractable. Using the sequence phasors of voltages and currents, a fault severity index (FSI) is calculated, the magnitude of which is an indicator of the amount of EVD at a bad joint and the angle of which indicates the phase or phases which has/have the bad joint(s).

Figure 2:
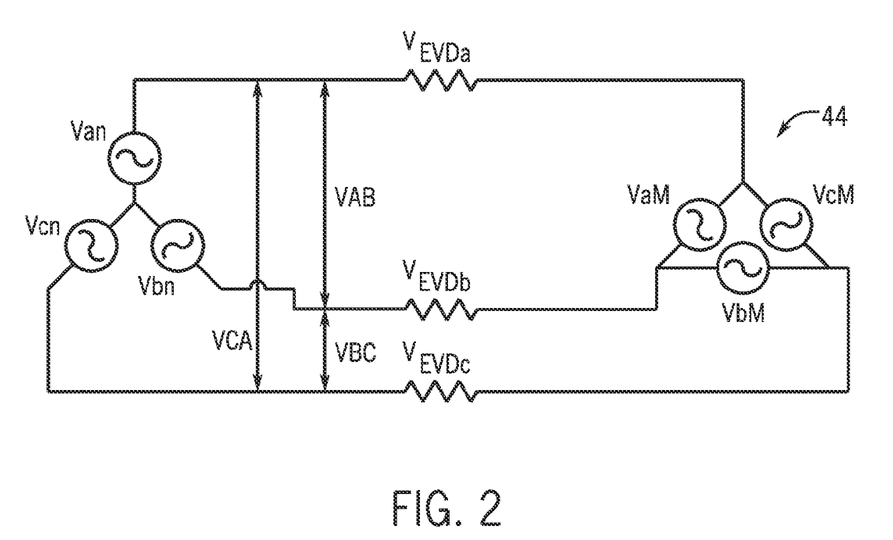
FIG. 2 is a schematic diagram of a delta connected motor and an EVD fault therein according to an embodiment of the invention.
Figure 3:
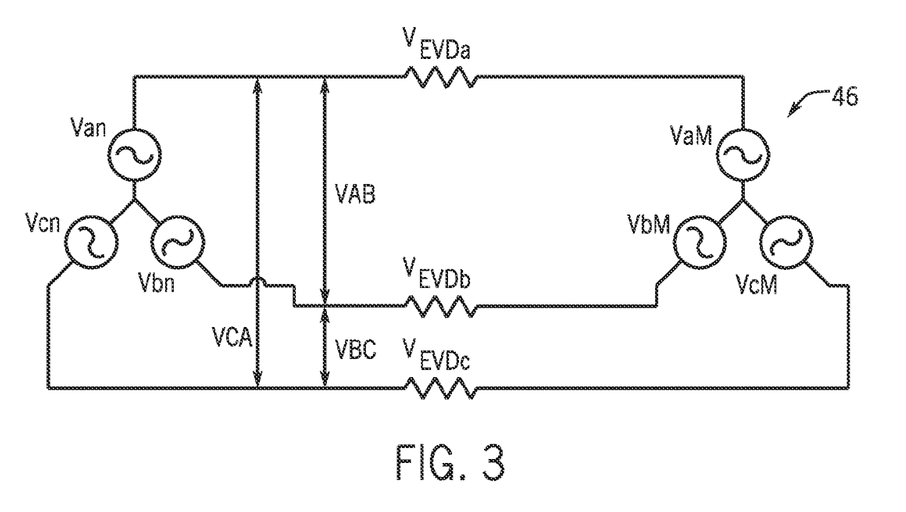
FIG. 3 is a schematic diagram of a star connected motor and an EVD fault therein according to an embodiment of the invention.

Embodiments of the invention are provided for detecting the existence of an EVD in a three-phase motor circuit in either a delta connected motor circuit or a star connected motor circuit. An illustration of a delta connected motor circuit 44 is provided in FIG. 2. In FIG. 2, the supply line voltages $V_a$, $V_b$, $V_c$ are illustrated, as are the phase voltages at the motor terminals $V_{aM}$, $V_{bM}$, $V_{cM}$ that are present at the motor—with the motor terminal voltages that are present being determined in part by any voltage drop (EVD) present in the motor circuit 44 on one or more of the phases, which are indicated as $V_{EVDa}$, $V_{EVDb}$, $V_{EVDc}$. An illustration of a star connected motor circuit 46 is provided in FIG. 3. In FIG. 3, the supply voltages $V_a$, $V_b$, $V_c$ are illustrated, as are the phase voltages at the motor terminals $V_{aM}$, $V_{bM}$, $V_{cM}$ that are present at the motor—with the motor terminal voltages that are present being determined in part by any excess voltage drop (EVD) present in the motor circuit 46 on one or more of the phases, which are indicated as $V_{EVDa}$, $V_{EVDb}$, $V_{EVDc}$.

Figure 4:
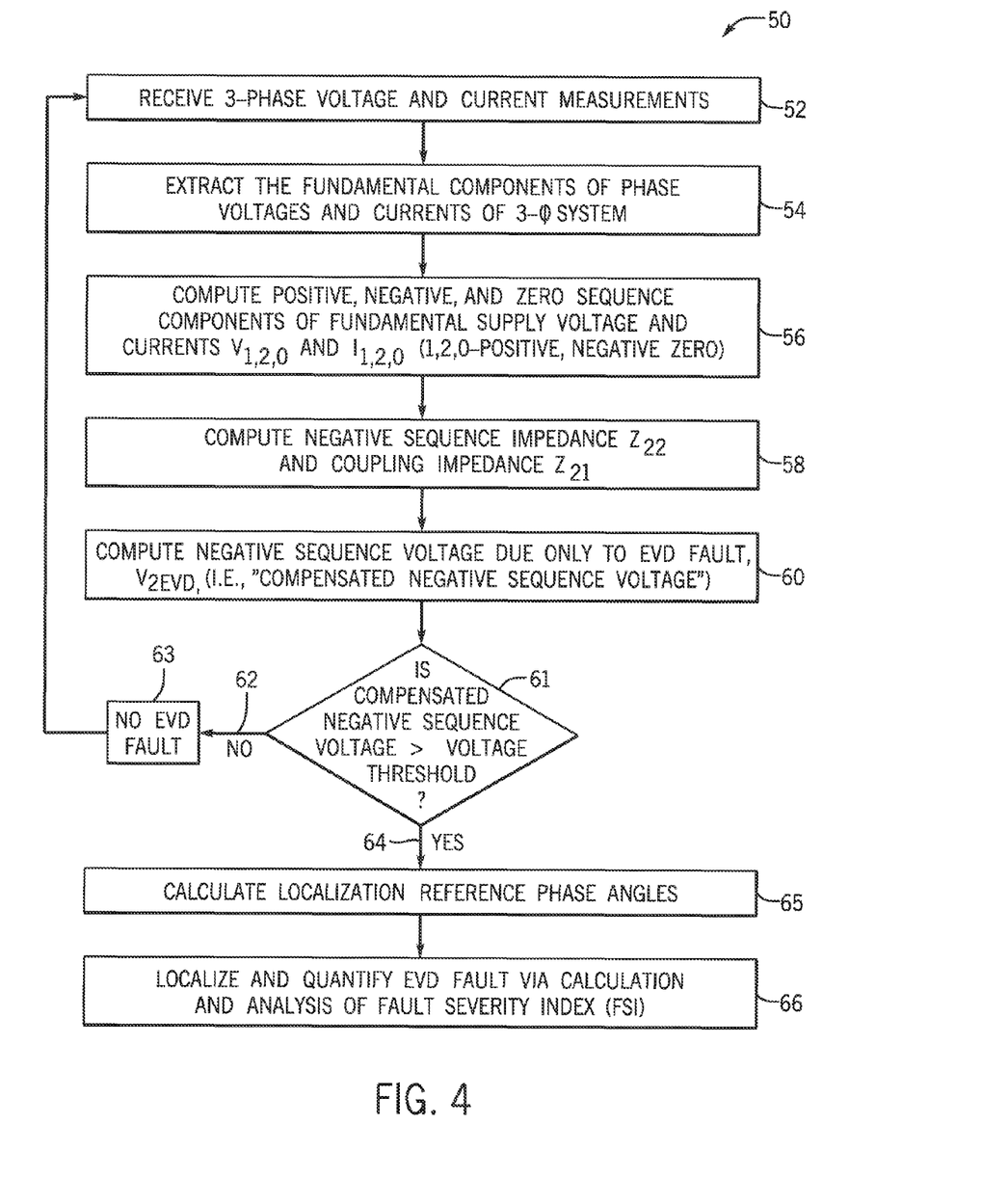
FIG. 4 is a flowchart illustrating a technique for detecting excess voltage drops in three-phase AC circuits according to an embodiment of the invention.

Referring now to FIG. 4, and with continued reference to FIGS. 1-3, a technique 50 is illustrated that is implemented by the processor 42 of diagnostic system 40 to identify the presence of an EVD fault in a delta or star connected electrical distribution (motor) circuit 10, according to an embodiment of the invention. Performing of the technique 50 (and the steps included therein) is first described here below with respect to a delta connected motor as in FIG. 2 and will later be described with respect to a star connected motor as in FIG. 3.

In a first step of the technique 50, three-phase current and voltage measurements are received by the processor 42 at STEP 52. According to an exemplary embodiment, the processor 42 receives three-phase power data (current and voltage data) as measured in the MCC, with the voltages and currents from the MCC 24 being subsequently supplied to the terminals 20 of the electrical machine 14—such as an induction motor, for example. Upon receiving the three-phase current and voltage measurements, the processor 42 then extracts the fundamental components of the three-phase power (fundamental components of the currents and voltages) at STEP 54 according to a known technique/method. STEP 54 is shown in phantom in FIG. 4 as it is recognized that determination of the fundamental components is optional for performing of the technique 50—as detecting, localizing and quantifying an EVD fault in the electrical distribution circuit 10 can be performed without the fundamental components. However, it is recognized that the most accurate analysis of EVD faults is achieved via determination and use of the fundamental components, as is described here below.

As shown in FIG. 4, the technique 50 continues with the computing of sequence components of the fundamental supply voltages and currents at STEP 56, with the sequence components of the voltages being identified as $V_{1,2,0}$ and the sequence components of the currents being identified as $I_{1,2,0}$, where the positive, negative and zero sequence components are identified by 1, 2, and 0, respectively. With respect to determining the voltage sequence components, it is recognized that Kirchoff's Voltage Law (KVL) can be applied to the connected motor circuit to describe the relationship between the supply line voltages, phase voltages at the motor terminals, and the EVDs in equation form according to:

$$\begin{bmatrix} V_{aM} \\ V_{bM} \\ V_{cM} \end{bmatrix} = \begin{bmatrix} V_a \\ V_b \\ V_c \end{bmatrix} - \begin{bmatrix} V_{EVDa} - V_{EVDb} \\ V_{EVDb} - V_{EVDc} \\ V_{EVDc} - V_{EVDa} \end{bmatrix}, \quad [\text{Eqn. 1}]$$

where $V_{aM}$, $V_{bM}$, $V_{cM}$ are the phase voltages at the motor terminals, $V_a$, $V_b$, $V_c$ are the supply line voltages, and as $V_{EVDa}$, $V_{EVDb}$, $V_{EVDc}$ are voltage drops in the phase A, B, C respectively representing an EVD.

The positive, negative and zero sequence components voltages can be obtained by applying a transformation T to Eqn. 1. According to one embodiment, a sequence transformation T is utilized to yield:

$$T * \begin{bmatrix} V_{aM} \\ V_{bM} \\ V_{cM} \end{bmatrix} = T * \begin{bmatrix} V_a \\ V_b \\ V_c \end{bmatrix} - T * \begin{bmatrix} 1 & -1 & 0 \\ 0 & 1 & -1 \\ -1 & 0 & 1 \end{bmatrix} * \begin{bmatrix} V_{EVDa} \\ V_{EVDb} \\ V_{EVDc} \end{bmatrix}. \quad \text{[Eqn. 2]}$$

According to one embodiment, the transformation T is defined according to:

$$T = \frac{1}{3}\begin{bmatrix} 1 & 1 & 1 \\ 1 & a & a^2 \\ 1 & a^2 & a \end{bmatrix},$$

where $$a = 1\angle 120 = -0.5 + j\frac{\sqrt{3}}{2}$$

(i.e., a unit vector at an angle of 120 degrees).

Considering the line drops in each phase are equal (i.e., no additional unbalance seen by the motor/motor terminals), then Eqn. 2 can be rewritten as:

$$\begin{bmatrix} V_{0M} \\ V_{1M} \\ V_{2M} \end{bmatrix} = \begin{bmatrix} V_0 \\ V_1 \\ V_2 \end{bmatrix} - \frac{1}{3}\begin{bmatrix} 1 & 1 & 1 \\ 1 & a & a^2 \\ 1 & a^2 & a \end{bmatrix} * \begin{bmatrix} 1 & -1 & 0 \\ 0 & 1 & -1 \\ -1 & 0 & 1 \end{bmatrix} * \begin{bmatrix} V_{EVDa} \\ V_{EVDb} \\ V_{EVDc} \end{bmatrix}, \quad \text{[Eqn. 3]}$$

where $V_{0M}$, $V_{1M}$ and $V_{2M}$ are the zero, positive and negative sequence voltages at the motor terminals and $V_0$, $V_1$ and $V_2$ are the zero, positive and negative sequence voltages due to supply unbalance.

Eqn. 3 can then be rewritten according to:

$$\begin{bmatrix} V_{0M} \\ V_{1M} \\ V_{2M} \end{bmatrix} = \begin{bmatrix} V_0 \\ V_1 \\ V_2 \end{bmatrix} - \frac{1}{3}\begin{bmatrix} 0 & 0 & 0 \\ 1-a^2 & a-1 & a^2-a \\ 1-a & a^2-1 & a-a^2 \end{bmatrix} * \begin{bmatrix} V_{EVDa} \\ V_{EVDb} \\ V_{EVDc} \end{bmatrix}. \quad \text{[Eqn. 4]}$$

Re-arranging the negative sequence equation to isolate the negative sequence voltage at the motor terminals, $V_{2M}$, yields:

$$V_{2M} = \quad \text{[Eqn. 5]}$$
$$V_2 - \frac{1}{3}\{(1-a)*V_{EVDa} + (a^2-1)*V_{EVDb} + (a-a^2)*V_{EVDc}\}.$$

Rearranging Eqn. 5 yields:

$$(1-a)*V_{EVDa}+(a^2-1)*V_{EVDb}+(a-a^2)*V_{EVDc}=3*(V_2-V_{2M}) \quad \text{[Eqn. 6]}.$$

The negative sequence voltage at the motor terminals, $V_{2M}$, can be estimated using impedance values in the electrical distribution circuit 10, along with the negative and positive sequence currents. More specifically, $$V_{2M} = Z_{21}*I_1 + Z_{22}*I_2 \quad \text{[Eqn. 7]},$$

where $Z_{22}$ is the negative sequence impedance of the motor, $Z_{21}$ is the coupling impedance between the negative sequence voltage and the positive sequence current, $I_1$ is the positive sequence current, and $I_2$ is the negative sequence current.

Thus, in order to estimate the negative sequence voltage at the motor terminals, $V_{2M}$, the technique 50 next estimates the negative sequence impedance $Z_{22}$ and the coupling impedance between the negative sequence voltage and the positive sequence current $Z_{21}$ at STEP 58. In estimating the impedances $Z_{22}$ and $Z_{21}$, it is assumed that the electrical machine is operating under healthy conditions, when all the connections in the electrical distribution circuit 10 are proper (i.e., there is no EVD fault due to improper connections). Assuming initially that there is no EVD fault in the downstream path and that line drops from a sensing point to the motor terminals are similar for each phase, then the negative sequence voltage is equal to the negative sequence voltage at the motor terminals (i.e., $V_2 = V_{2M}$). So, during initialization—assuming there is no EVD fault present on the motor downstream path—the impedance parameters $Z_{21}$ and $Z_{22}$ can be estimated using a nonlinear recursive fit.

Upon estimation of the impedance parameters $Z_{21}$ and $Z_{22}$, Eqn. 7 may be implemented to determine the negative sequence voltage at the motor terminals, $V_{2M}$. Upon determination of the negative sequence voltage at the motor terminals, $V_{2M}$, technique 50 continues as STEP 60 with the determination of the negative sequence voltage due only to EVD, $V_{2EVD}$,—i.e., a "compensated negative sequence voltage." The compensated negative sequence voltage, $V_{2EVD}$, can be determined according to:

$$V_{2EVD} = V_2 - V_{2M} \quad \text{[Eqn. 8]}.$$

By substituting Eqn. 8 into Eqn. 6, Eqn. 6 can be rewritten according to:

$$(1-a)*V_{EVDa}+(a^2-1)*V_{EVDb}+(a-a^2)*V_{EVDc}=3*V_{2EVD} \quad \text{[Eqn. 9]},$$

where $$(1-a)=\sqrt{3}\angle-30, (a^2-1)=\sqrt{3}\angle-150, \text{ and } (a-a^2)=\sqrt{3}\angle-90.$$

The above EVD characteristics equation, Eqn. 9, may be used to derive the conditions and relations to quantify and localize EVD faults in a single phase or multiple phases of the delta connected motor.

Referring still to FIG. 4, technique 50 continues at STEP 61 where it is determined whether the magnitude of the compensated negative sequence voltage, $V_{2EVD}$, is greater than a threshold voltage level, so as to enable a determination as to whether the compensated negative sequence voltage constitutes an EVD indicative of a high resistance connect fault in the distribution 10. It is recognized that the threshold voltage level can be set dependent on the severity at which an alarm is to be raised, and thus the threshold could be a pre-defined value in the program or could be determined from user settings or using user inputs. According to an exemplary embodiment, the voltage threshold is set at 100 mV—such that voltage drops greater than 100 mV are categorized as an EVD—although it is recognized that the threshold could be a higher or lower value. If it is determined at STEP 61 that compensated negative sequence voltage, $V_{2EVD}$, is less than the threshold voltage, as indicated at 62, then it is determined that there is no EVD in the system, as indicated at STEP 63. The technique then loops back to STEP 52 with the receiving of additional three-phase current and voltage measurements by the processor 42, such that monitoring for an EVD is continued.

Conversely, if it is determined at STEP 61 that the magnitude of the compensated negative sequence voltage, $V_{2EVD}$, is greater than the threshold voltage, as indicated at 64, then the technique continues at STEP 65 with the calculation of a localization reference phase angle for the each phase. According to an exemplary embodiment, the localization reference phase angles computed at STEP 65 are derived in part by using the phase angle of the fundamental current flowing through each respective phase—either in line or in phase. Thus, for Phase A, the localization reference phase angle can be described according to either:

$$\text{ref}\phi_{2EVDa} = -30 + \phi_{faline}$$

$$\text{ref}\phi_{2EVDa} = -60 + \phi_{faphase},$$

where $\phi_{faline}$ and $\phi_{faphase}$ are the angles of the fundamental component of the current flowing through Phase A in line and phase, respectively.

For Phase B, the localization reference phase angle can be described according to either:

$$\text{ref}\phi_{2EVDb} = -150 + \phi_{fbline}$$

$$\text{ref}\phi_{2EVDb} = -180 + \phi_{fbphase},$$

where $\phi_{fbline}$ and $\phi_{fbphase}$ are the angles of the fundamental component of the current flowing through Phase B in line and phase, respectively.

For Phase C, the localization reference phase angle can be described according to either:

$$\text{ref}\phi_{2EVDc} = 90 + \phi_{fcline}$$

$$\text{ref}\phi_{2EVDc} = 60 + \phi_{fcphase},$$

where $\phi_{fcline}$ and $\phi_{fcphase}$ are the angles of the fundamental component of the current flowing through Phase C in line and phase, respectively.

Figure 5:
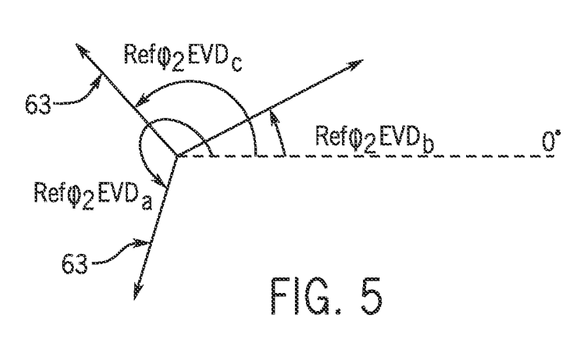
FIG. 5 is a phasor diagram illustrating localization reference phase angle phasors according to an embodiment of the invention.

A diagram of the localization reference phase angles computed at STEP 65 is provided in FIG. 5. As seen therein, each localization reference phase angle is a fault reference current phasor 63. The fault reference current phasor 63 are spaced 120 degrees apart, with the exact angle of each phasor dependent on whether the current flowing in line or phase is measured/determined.

Upon determination of the localization reference phase angles at STEP 65, a localization and quantification of the EVD is next performed at STEP 66. According to embodiments of the invention, localization and quantification of the EVD at STEP 66 may be performed via a calculation and analysis of a FSI—with the FSI being a phasor having a magnitude that is an indicator of the amount of EVD and an angle that indicates the phase or phases on which the EVD is present. With respect to the magnitude of the FSI phasor, the amount of EVD is derived from the compensated negative sequence voltage, $V_{2EVD}$, as described in Eqn. 8—with the compensated negative sequence voltage being broken down by phase as described in Eqn. 9. With respect to the angle of the of the FSI phasor, the phase or phases to which the EVD is to be attributed to (i.e., localizing of the EVD) is determined by a comparison of a phase angle of the compensated negative sequence voltage to the localization reference phase angles for each phase.

Figure 6:
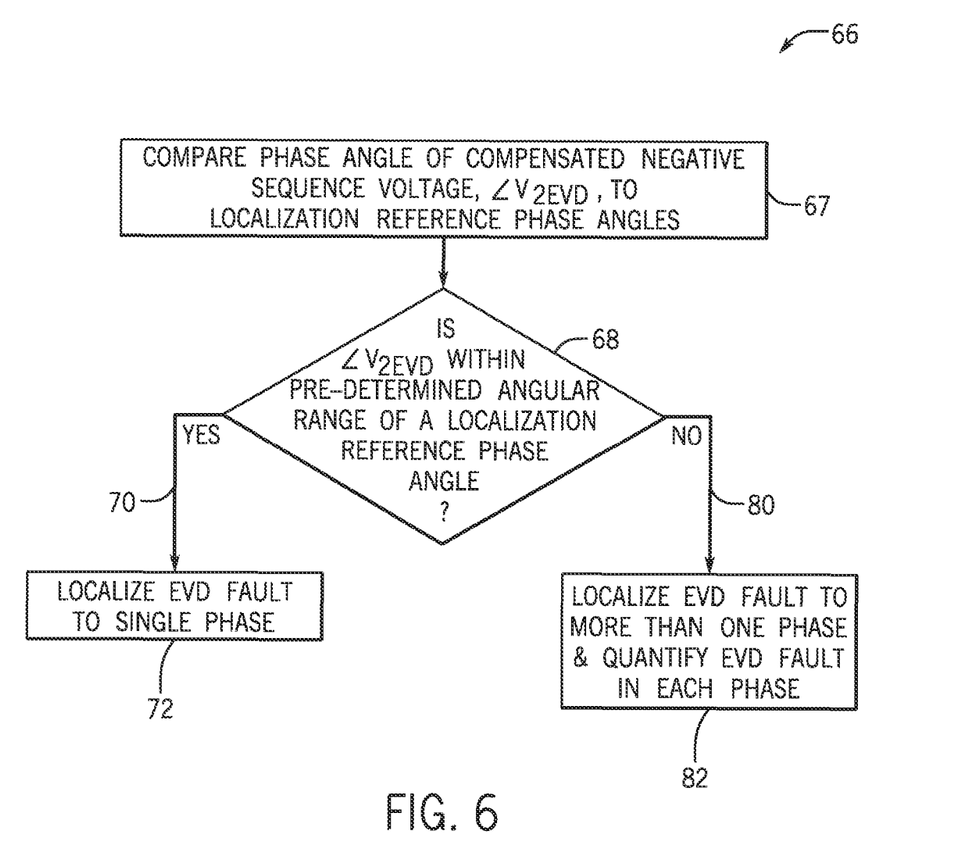
FIG. 6 is flowchart illustrating sub-steps of STEP 66 in FIG. 4 for localizing of an EVD to one or more phases in a three-phase AC circuit according to an embodiment of the invention.

Referring now to FIG. 6, the localizing of the EVD to one or more phases in the electrical distribution circuit that is performed at STEP 66 is further illustrated as a series of sub-steps. In a first step, the phase angle of the compensated negative sequence voltage is compared to the localization reference phase angles for each phase of the distribution circuit—as indicated at STEP 67. A determination is then made at STEP 68 as to whether the phase angle of the compensated negative sequence voltage is within a pre-determined angular range of any one of the localization reference phase angles. According to an exemplary embodiment, a determination is made at STEP 68 regarding whether the angle of the compensated negative sequence voltage is within 15 degrees of any of the localization reference phase angles—i.e., plus or minus 15 degrees of angular range from each localization reference phase angle. It is recognized that the pre-determined difference between the phase angle of the compensated negative sequence voltage and the localization reference phase angles is not required to be within 15 degrees, as a different angular range could instead be selected.

If it is determined at STEP 68 that the phase angle of the compensated negative sequence voltage is within a pre-determined angular range of any one of the localization reference phase angles, as indicated at 70, then the technique continues at STEP 72 by localizing the EVD fault to the particular phase corresponding to the localization reference phase angle to which the angle of the compensated negative sequence voltage is within the pre-determined angular range to. Examples of the EVD fault occurring on each of Phase A, B and C—and the describing thereof by way of Eqn. 9—are set forth here below for purposes of illustration.

In an occurrence where the EVD is present in Phase A—i.e., $|(\text{ref}\phi_{2EVDa} - \angle V_{2EVD})| < 15°$—then the EVD in Phases B and C are assigned as $V_{EVDb} = 0$ and $V_{EVDc} = 0$, such that Eqn. 9 becomes:

$$(1-a)*V_{EVDa} = 3*|V_{2EVD}| \qquad \text{[Eqn. 10]}.$$

As the magnitude of the EVD fault is being sought, the term $(1-a)$ can be removed from Eqn. 10, such that the EVD fault in Phase A is calculated according to:

$$|V_{EVDa}| * \sqrt{3} * |V_{2EVD}|.$$

Figure 7:
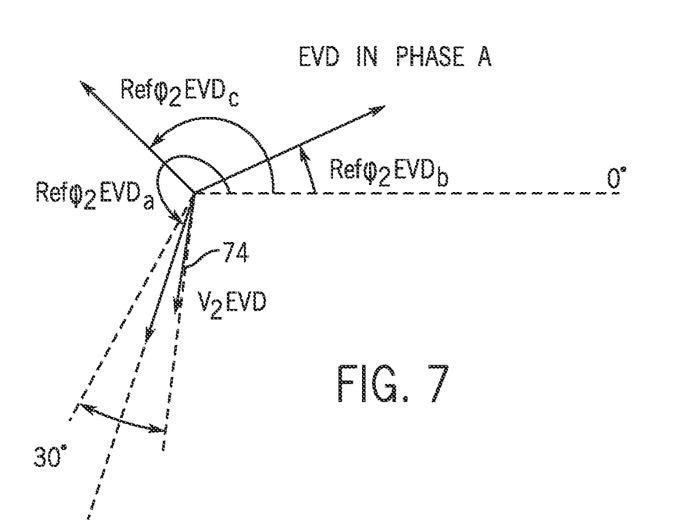
FIGS. 7-9 are phasor diagrams illustrating an EVD in Phases A, B and C, respectively, of a three-phase AC circuit.

An illustration of a FSI phasor 74—having a magnitude indicating an amount of EVD and an angle indicating that the EVD is in Phase A—is provided in FIG. 7. As shown therein, the FSI phasor 74 has an angle that is within the pre-determined range of +/−15 degrees of the localization reference phase angle for Phase A.

In an occurrence where the EVD is present in Phase B—i.e., $|(\text{ref}\phi_{2EVDb} - \angle V_{2EVD})| < 15°$—then the EVD in Phases A and C are assigned as $V_{EVDa} = 0$ and $V_{EVD} = 0$, such that Eqn. 9 becomes:

$$((a^2 - 1)*V_{EVDb}) = 3*V_{2EVD} \qquad \text{[Eqn. 11]}.$$

As the magnitude of the EVD fault is being sought, the term $(a^2 - 1)$ can be removed from Eqn. 11, such that the EVD fault in Phase B is calculated according to:

$$|V_{EVDb}| = \sqrt{3} * |V_{2EVD}|.$$

Figure 8:
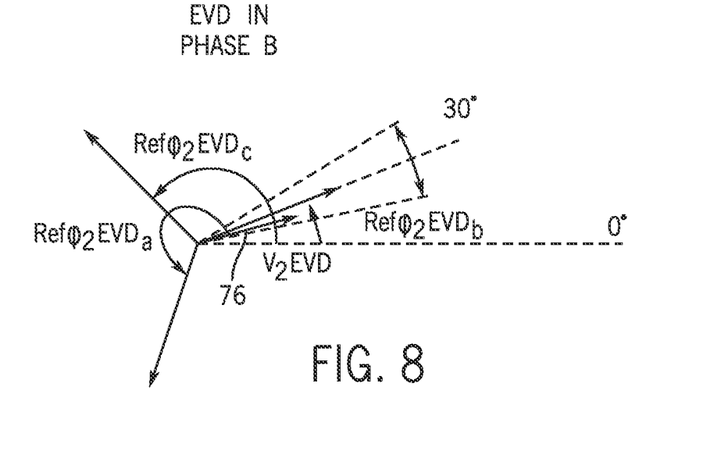

An illustration of a FSI phasor 76—having a magnitude indicating an amount of EVD and an angle indicating that the EVD is in Phase B—is provided in FIG. 8. As shown therein, the FSI phasor 76 has an angle that is within the pre-determined range of +/−15 degrees of the localization reference phase angle for Phase B.

In an occurrence where the EVD is present in Phase C—i.e., $|(\text{ref}\phi_{2EVDc} - \angle V_{2EVD})| < 15°$—then the EVD in Phases A and B are assigned as $V_{EVDa} = 0$ and $V_{EVDb} = 0$, such that Eqn. 9 becomes:

$$((a - a^2)*V_{EVDc}) = 3*V_{2EVD} \qquad \text{[Eqn. 12]}.$$

As the magnitude of the EVD fault is being sought, the term $(a - a_2)$ can be removed from Eqn. 12, such that the EVD fault in Phase C is calculated according to:

$$|V_{EVDc}| = \sqrt{3} * |V_{2EVD}|.$$

Figure 9:
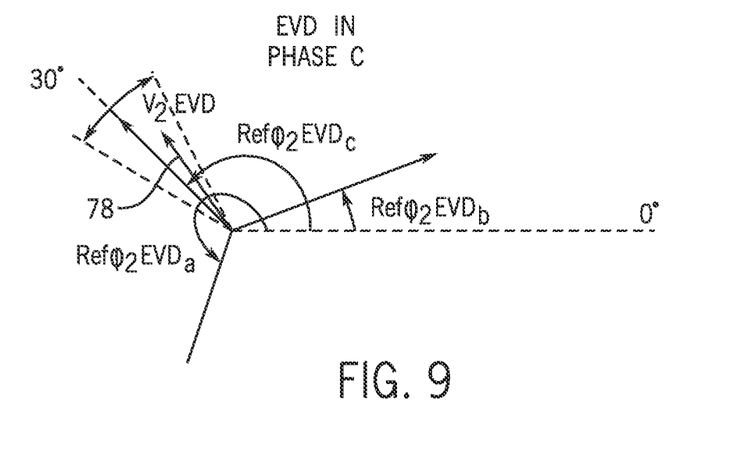

An illustration of a FSI phasor 78—having a magnitude indicating an amount of EVD and an angle indicating that the EVD is in Phase C—is provided in FIG. 9. As shown therein, the FSI phasor 78 has an angle that is within the pre-determined range of +/−15 degrees of the localization reference phase angle for Phase C.

Referring again now to FIG. 6, if it is instead determined at STEP 68 that the phase angle of the compensated negative sequence voltage is not within a pre-determined angular range of any one of the localization reference phase angles, as indicated at 80, then the technique continues at STEP 82 by localizing the FSI (and EVD) to more than one phase of the electrical distribution system 10. In localizing the EVD to more than one phase, the FSI is resolved along multiple axes to quantify an amount of EVD in each of the phases to which the EVD has been localized. That is, the magnitude of the FSI is proportioned amongst two or more phases to determine the amount of EVD in each of the phases. Examples of the EVD fault occurring in differing combinations of Phases A, B and C—and the describing thereof by way of Eqn. 9—are set forth here below for purposes of illustration.

In an occurrence where the EVD is present in Phases A and B—i.e., $\text{ref}\phi_{2EVDa} < \angle V_{2EVD} < \text{ref}\phi_{2EVDb}$—then the EVD in Phase C is assigned as $V_{EVDc}=0$, such that Eqn. 9 becomes:

$$((1-a)*V_{EVDa}+(a^2-1)*V_{EVDb})=3*V_{2EVD} \quad \text{[Eqn. 13]},$$

In Eqn. 13, rewriting $V_{EVDa}$ and $V_{EVDb}$ in the complex domain gives:

$$V_{EVDa}=|V_{EVDa}|(\cos \phi_{1a}+j \sin \phi_{1a}))$$

$$V_{EVDb}=|V_{EVDb}|(\cos \phi_{1b}+j \sin \phi_{1b}))$$

and substituting these values into Eqn. 13 results in:

$$\sqrt{3}*[|V_{EVDa}|(\cos(\phi_{fa}-30)+j \sin(\phi_{fa}-30))+|V_{EVDb}|(\cos(\phi_{fb}-150)+j \sin(\phi_{fb}-150))]=3*|V_{2EVD}|*\{\cos(\angle V_{2EVD})+j \sin(\angle V_{2EVD})\} \quad \text{[Eqn. 14]}.$$

Comparing the real and imaginary parts of Eqn. 14 yields:

$$|V_{EVDa}|\cos(\phi_{fa}-30)+|V_{EVDb}|\cos(\phi_{fb}-150)=\sqrt{3}*|V_{2EVD}|*\cos(\angle V_{2EVD})$$

$$|V_{EVDa}|\sin(\phi_{fa}-30)+|V_{EVDb}|\sin(\phi_{fb}-150)=\sqrt{3}*|V_{2EVD}|*\sin(\angle V_{2EVD}),$$

which when solved provide:

$$FSI_A = |V_{EVDa}| = \sqrt{3} *|V_{2EVD}|* \frac{\sin(\varphi_{fb} - 150 - \angle V_{2EVD})}{\sin(\varphi_{fb} - 150 - \varphi_{fa} + 30)} \quad \text{[Eqn. 15]}$$

$$FSI_B = |V_{EVDb}| = \sqrt{3} *|V_{2EVD}|* \frac{\sin(\varphi_{fa} - 30 - \angle V_{2EVD})}{\sin(\varphi_{fa} - 30 - \varphi_{fb} + 150)}.$$

Eqn. 15 thus enables the FSI to be resolved along multiple axes—Phases A and B—to quantify an amount of EVD in each of the phases to which the EVD has been localized.

In an occurrence where the EVD is present in Phases B and C—i.e., $\text{ref}\phi_{2EVDb} < \angle V_{2EVD} < \text{ref}\phi_{2EVDc}$—then the EVD in Phase A is assigned as $V_{EVDa}=0$, such that Eqn. 9 becomes:

$$((a^2-1)*V_{EVDb}+(a-a)*V_{EVDc})=3*V_{2EVD} \quad \text{[Eqn. 16]},$$

Similar to that described above, $V_{EVDb}$ and $V_{EVDc}$ can be rewritten in the complex domain and substituted back into Eqn. 16, with the real and imaginary parts being compared and solved to provide:

$$FSI_B = |V_{EVDb}| = \sqrt{3} *|V_{2EVD}|* \frac{\sin(\varphi_{fc} + 90 - \angle V_{2EVD})}{\sin(\varphi_{fc} + 90 - \varphi_{fb} + 150)} \quad \text{[Eqn. 17]}$$

$$FSI_C = |V_{EVDc}| = \sqrt{3} *|V_{2EVD}|* \frac{\sin(\varphi_{fb} - 150 - \angle V_{2EVD})}{\sin(\varphi_{fb} - 150 - \varphi_{fc} - 90)}.$$

Eqn. 17 thus enables the FSI to be resolved along multiple axes—Phases B and C—to quantify an amount of EVD in each of the phases to which the EVD has been localized.

In an occurrence where the EVD is present in Phases A and C—i.e., $\text{ref}\phi_{2EVDc} < \angle V_{2EVD} < \text{ref}\phi_{2EVDa}$—then the EVD in Phase B is assigned as $V_{EVDb}=0$, such that Eqn. 9 becomes:

$$((1-a)*V_{EVDa}+(a-a^2)*V_{EVDc})=3*V_{2EVD} \quad \text{[Eqn. 18]},$$

Similar to that described above, $V_{EVDa}$ and $V_{EVDc}$ can be rewritten in the complex domain and substituted back into Eqn. 18, with the real and imaginary parts being compared and solved to provide:

$$FSI_C = |V_{EVDc}| = \sqrt{3} *|V_{2EVD}|* \frac{\sin(\varphi_{fa} - 30 - \angle V_{2EVD})}{\sin(\varphi_{fa} - 30 - \varphi_{fc} - 90)} \quad \text{[Eqn. 19]}$$

$$FSI_A = |V_{EVDa}| = \sqrt{3} *|V_{2EVD}|* \frac{\sin(\varphi_{fc} + 90 - \angle V_{2EVD})}{\sin(\varphi_{fc} + 90 - \varphi_{fa} + 30)}.$$

Eqn. 19 thus enables the FSI to be resolved along multiple axes—Phases C and A—to quantify an amount of EVD in each of the phases to which the EVD has been localized.

Figure 10:
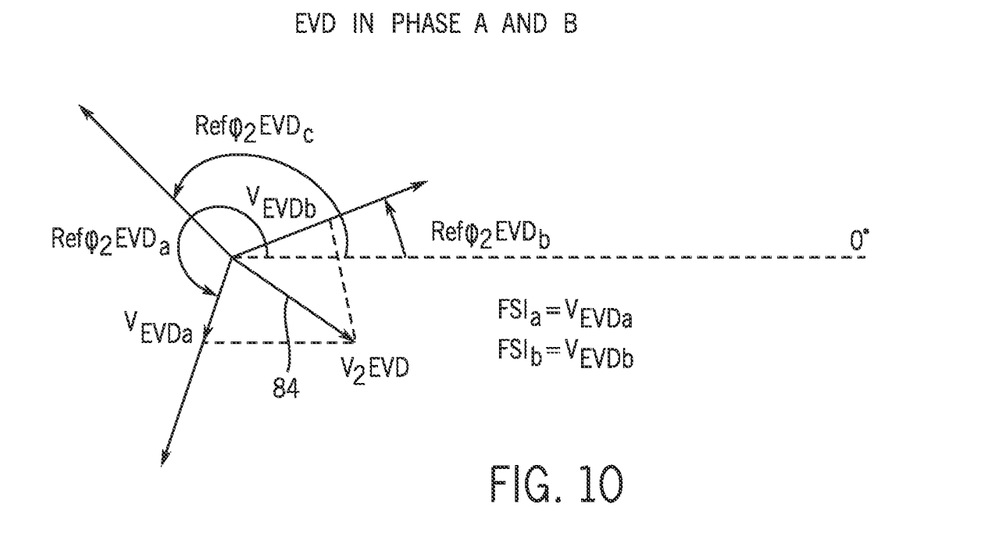
FIG. 10 is a phasor diagram illustrating an EVD in more than one phase of a three-phase AC circuit.

An example of an FSI phasor present on more than one phase of the electrical distribution system 10 is provided in FIG. 10—with the illustrated example showing an FSI phasor 84 present on Phases A and B of the electrical distribution circuit. The magnitude of the FSI phasor 84 indicates an amount of the EVD, with the particular angle of the FSI phasor 84 being resolved to quantify the amount of EVD in each of Phase A and B.

As indicated previously, the technique 50 illustrated in FIG. 4 can be performed for a star connected motor circuit 46 as in FIG. 3. Thus, the technique 50 of FIG. 4 is again now described here with specific regard to the determining of an FSI and accompanying EVD fault in a star connected motor. Technique 50 begins by receiving three-phase current and voltage measurements at STEP 52 and extracting the fundamental components of the three-phase currents and voltages at STEP 54. The technique 50 continues with the computing of sequence components of the fundamental supply voltages and currents at STEP 56, with the sequence components of the voltages being identified as $V_{1,2,0}$ and the sequence components of the currents being identified as $I_{1,2,0}$, where the positive, negative and zero sequence components are identified by 1, 2, and 0, respectively. With respect to determining the voltage sequence components, it is recognized that Kirchoff's Voltage Law (KVL) can be applied to the connected motor circuit to describe the relationship between the supply line voltages, phase voltages at the motor terminals, and the EVDs in equation form according to:

$$\begin{bmatrix} V_{aM} \\ V_{bM} \\ V_{cM} \end{bmatrix} = \begin{bmatrix} V_a \\ V_b \\ V_c \end{bmatrix} - \begin{bmatrix} V_{EVDa} \\ V_{EVDb} \\ V_{EVDc} \end{bmatrix}, \quad \text{[Eqn. 20]}$$

where $V_{aM}$, $V_{bM}$, $V_{cM}$ are the phase voltages at the, $V_a$, $V_b$, $V_c$ are the supply line voltages, and as $V_{EVDa}$, $V_{EVDb}$, $V_{EVDc}$ are voltage drops in the phase A, B, C respectively representing an EVD. Eqn. 20 differs from Eqn. 1 (for a delta connected motor), as the phase voltage is analyzed rather than line voltages.

The positive, negative and zero sequence components voltages can be obtained by applying a transformation T to Eqn. 20. According to one embodiment, a sequence transformation T is utilized to yield:

$$T * \begin{bmatrix} V_{aM} \\ V_{bM} \\ V_{cM} \end{bmatrix} = T * \begin{bmatrix} V_a \\ V_b \\ V_c \end{bmatrix} - T * \begin{bmatrix} V_{EVDa} \\ V_{EVDb} \\ V_{EVDc} \end{bmatrix}. \quad \text{[Eqn. 21]}$$

According to one embodiment, the transformation T is defined according to:

$$T = \frac{1}{3}\begin{bmatrix} 1 & 1 & 1 \\ 1 & a & a^2 \\ 1 & a^2 & a \end{bmatrix},$$

where $$a = 1\angle 120 = -0.5 + j\frac{\sqrt{3}}{2}$$

(i.e., a unit vector at an angle of 120 degrees).

Considering the line drops in each phase are equal (i.e., no additional unbalance seen by the motor/motor terminals), then Eqn. 21 can be rewritten as:

$$\begin{bmatrix} V_{0M} \\ V_{1M} \\ V_{2M} \end{bmatrix} = \begin{bmatrix} V_0 \\ V_1 \\ V_2 \end{bmatrix} - \frac{1}{3}\begin{bmatrix} 1 & 1 & 1 \\ 1 & a & a^2 \\ 1 & a^2 & a \end{bmatrix} * \begin{bmatrix} V_{EVDa} \\ V_{EVDb} \\ V_{EVDc} \end{bmatrix}, \quad \text{[Eqn. 22]}$$

where $V_{0M}$, $V_{1m}$ and $V_{2M}$ are the zero, positive and negative sequence voltages at the motor terminals and $V_0$, $V_1$ and $V_2$ are the zero, positive and negative sequence voltages due to supply unbalance.

Eqn. 22 can then be rewritten according to:

$$\begin{bmatrix} V_{0M} \\ V_{1M} \\ V_{2M} \end{bmatrix} = \begin{bmatrix} V_0 \\ V_1 \\ V_2 \end{bmatrix} - \frac{1}{3}\begin{bmatrix} 0 & 0 & 0 \\ 1-a^2 & a-1 & a^2-a \\ 1-a & a^2-1 & a-a^2 \end{bmatrix} * \begin{bmatrix} V_{EVDa} \\ V_{EVDb} \\ V_{EVDc} \end{bmatrix}. \quad \text{[Eqn. 23]}$$

Re-arranging the negative sequence equation to isolate the negative sequence voltage at the motor terminals, $V_{2M}$, yields:

$$V_{2M} = V_2 - \frac{1}{3}(V_{EVDa} + a^2 V_{EVDb} + a V_{EVDc}). \quad \text{[Eqn. 24]}$$

Rearranging Eqn. 24 yields:

$$V_{EVDa} + a^2 V_{EVDb} + a V_{EVDc} = 3*(V_2 - V_{2M}) \quad \text{[Eqn. 25]}.$$

As previously described, the negative sequence voltage at the motor terminals, $V_{2M}$, can be estimated using impedance values in the electrical distribution circuit 10. Thus, the negative sequence impedance $Z_{22}$ and the coupling impedance between the negative sequence voltage and the positive sequence current $Z_{21}$ are estimated at STEP 58 and, upon estimation of the impedance parameters $Z_{21}$ and $Z_{22}$, the negative sequence voltage at the motor terminals, $V_{2M}$ is determined.

Upon determination of the negative sequence voltage at the motor terminals, $V_{2M}$, technique 50 continues as STEP 60 with the determination of the compensated negative sequence voltage (i.e., negative sequence voltage due only to EVD), $V_{2EVD}$. The compensated negative sequence voltage, $V_{2EVD}$, can be substituted into Eqn. 25 to yield:

$$V_{EVDa} + a^2 V_{EVDb} + a V_{EVDc} = 3*V_{2EVD} \quad \text{[Eqn. 26]}.$$

The above EVD characteristics equation, Eqn. 26, may be used to derive the conditions and relations to quantify and localize EVD faults in a single phase or multiple phases of the star connected motor.

Referring still to FIG. 4, technique 50 continues as STEP 65 with the calculation of a localization reference phase angle for the each phase. According to an exemplary embodiment, the localization reference phase angles computed at STEP 65 are derived in part by using the angle of the fundamental component of line current flowing through each respective phase. Thus, for Phase A, the localization reference phase angle can be described according to:

$$\text{ref}\phi_{2EVDa} = \phi_{fa},$$

where $\phi_{fa}$ is the angles of the fundamental component of line current flowing through Phase A.

For Phase B, the localization reference phase angle can be described according to:

$$\text{ref}\phi_{2EVDb} = \phi_{fb},$$

where $\phi_{fb}$ is the angles of the fundamental component of line current flowing through Phase B.

For Phase C, the localization reference phase angle can be described according to:

$$\phi_{2EVDc} = \phi_{fc},$$

where $\phi_{fc}$ is the angles of the fundamental component of line current flowing through Phase C.

The respective localization reference phase angles computed at STEP 65 are provided in FIG. 5. As seen therein, each localization reference phase angle is a fault reference current phasor 63, with the phasors being spaced 120 degrees apart.

Upon determination of the localization reference phase angles at STEP 65, a calculation of the EVD is next performed at STEP 66. A calculation of the EVD at STEP 66 may be described alternately as a calculation of an FSI—with the FSI being a phasor having a magnitude that is an indicator of the amount of EVD and an angle that indicates the phase or phases on which the EVD is present. With respect to the magnitude of the of the FSI phasor, the amount of EVD is derived from the compensated negative sequence voltage, $V_{2EVD}$, as described in Eqn. 8—with the compensated negative sequence voltage being broken down by phase as described in Eqn. 26. With respect to the angle of the of the FSI phasor, the phase or phases to which the EVD is to be attributed to (i.e., localizing of the EVD) is determined by a comparison of a phase angle of the compensated negative sequence voltage to the localization reference phase angles for each phase.

As shown in FIG. 6, the localizing of the EVD to one or more phases in the electrical distribution circuit begins with a comparison of the phase angle of the compensated negative sequence voltage to the localization reference phase angles for each phase of the distribution circuit as indicated at STEP 67. A determination is then made at STEP 68 as to whether the phase angle of the compensated negative sequence voltage is within a pre-determined angular range of any one of the localization reference phase angles (e.g., +/−15 degrees of any of the localization reference phase angles).

If it is determined at STEP 68 that the phase angle of the compensated negative sequence voltage is within a pre-determined angular range of any one of the localization reference phase angles, as indicated at 70, then the technique continues at STEP 72 by localizing the EVD fault to the particular phase corresponding to the localization reference phase angle to which the angle of the compensated negative sequence voltage is within the pre-determined angular range to. Examples of the EVD fault occurring on each of Phase A, B and C—and the describing thereof by way of Eqn. 26—are set forth here below for purposes of illustration.

In an occurrence where the EVD is present in Phase A—i.e., $|(\text{ref}\phi_{2EVDa} - \angle V_{2EVD})| < 15°$—then the EVD in Phases B and C are assigned as $V_{EVDb}=0$ and $V_{EVDc}=0$, such that Eqn. 26 becomes:

$$V_{EVDa} = 3*V_{2EVD} \quad \text{[Eqn. 27]}.$$

As the magnitude of the EVD fault is being sought, the EVD fault in Phase C is calculated according to:

$$|V_{EVDa}| = 3*|V_{2EVD}|.$$

In an occurrence where the EVD is present in Phase B—i.e., $|(\text{ref}\phi_{2EVDb} - \angle V_{2EVD})| < 15°$—then the EVD in Phases A and C are assigned as $V_{EVDa}=0$ and $V_{EVDc}=0$, such that Eqn. 26 becomes:

$$a^2 V_{EVDb} = 3*V_{2EVD} \quad \text{[Eqn. 28]}.$$

As the magnitude of the EVD fault is being sought, the $a^2$ term can be removed from Eqn. 28, such that the EVD fault in Phase B is calculated according to:

$$|V_{EVDb}| = 3*|V_{2EVD}|.$$

In an occurrence where the EVD is present in Phase C—i.e., $|(\text{ref}\phi_{2EVDc} - \angle V_{2EVD})| < 15°$—then the EVD in Phases A and B are assigned as $V_{EVDa}=0$ and $V_{EVDb}=0$, such that Eqn. 26 becomes:

$$a V_{EVDc} = 3*V_{2EVD} \quad \text{[Eqn. 29]}.$$

As the magnitude of the EVD fault is being sought, the a term can be removed from Eqn. 29, such that the EVD fault in Phase C is calculated according to:

$$|V_{EVDc}| = 3*|V_{2EVD}|.$$

Illustrations of FSI phasors indicating that the EVD is in Phase A, B or C are provided in FIGS. 7-9. As shown therein, each of the FSI phasors 74, 76, 78 has an angle that is within the pre-determined range of +/−15 degrees of the localization reference phase angle for a respective one of Phase A, B or C.

Referring again now to FIG. 6, if it is instead determined at STEP 68 that the phase angle of the compensated negative sequence voltage is not within a pre-determined angular range of any one of the localization reference phase angles, as indicated at 80, then the technique continues at STEP 82 by localizing the FSI (and EVD) to more than one phase of the electrical distribution system 10. In localizing the EVD to more than one phase, the FSI is resolved along multiple axes to quantify an amount of EVD in each of the phases to which the EVD has been localized. That is, the magnitude of the FSI is proportioned amongst two or more phases to determine the amount of EVD in each of the phases. Examples of the EVD fault occurring in differing combinations of Phases A, B and C—and the describing thereof by way of Eqn. 26—are set forth here below for purposes of illustration.

In an occurrence where the EVD is present in Phases A and B—i.e., $\text{ref}\phi_{2EVDa} < \angle V_{2EVD} < \text{ref}\phi_{2EVDb}$—then the EVD in Phase C is assigned as $V_{EVDc}=0$, such that Eqn. 26 becomes:

$$V_{EVDa} + a^2 V_{EVDb} = 3*V_{2EVD} \quad \text{[Eqn. 30]},$$

Rewriting Eqn. 30 in the complex domain and solving for real and imaginary parts yields:

$$FSI_A = |V_{EVDa}| = 3*|V_{2EVD}| * \frac{\sin(\varphi_{fb} + 240 - \angle V_{2EVD})}{\sin(\varphi_{fb} + 240 - \varphi_{fa})} \quad \text{[Eqn. 31]}$$

$$FSI_B = |V_{EVDb}| = 3*|V_{2EVD}| * \frac{\sin(\varphi_{fa} - \angle V_{2EVD})}{\sin(\varphi_{fa} - \varphi_{fb} - 240)}.$$

Eqn. 31 thus enables the FSI to be resolved along multiple axes—Phases A and B—to quantify an amount of EVD in each of the phases to which the EVD has been localized.

In an occurrence where the EVD is present in Phases B and C—i.e., $\text{ref}\phi_{2EVDb} < \angle V_{2EVD} < \text{ref}\phi_{2EVDc}$—then the EVD in Phase A is assigned as $V_{EVDa}=0$, such that Eqn. 26 becomes:

$$a^2 V_{EVDb} + a V_{EVDc} = 3*V_{2EVD} \quad \text{[Eqn. 32]},$$

Rewriting Eqn. 32 in the complex domain and solving for real and imaginary parts yields:

$$FSI_B = |V_{EVDb}| = 3*|V_{2EVD}| * \frac{\sin(\varphi_{fc} + 120 - \angle V_{2EVD})}{\sin(\varphi_{fc} + 120 - \varphi_{fb} - 240)} \quad \text{[Eqn. 33]}$$

$$FSI_C = |V_{EVDc}| = 3*|V_{2EVD}| * \frac{\sin(\varphi_{fb} + 240 - \angle V_{2EVD})}{\sin(\varphi_{fb} + 240 - \varphi_{fc} - 120)}.$$

Eqn. 33 thus enables the FSI to be resolved along multiple axes—Phases B and C—to quantify an amount of EVD in each of the phases to which the EVD has been localized.

In an occurrence where the EVD is present in Phases A and C—i.e., $\text{ref}\phi_{2EVDc} < \angle V_{2EVD} < \text{ref}\phi_{2EVDa}$—then the EVD in Phase B is assigned as $V_{EVDb}=0$, such that Eqn. 26 becomes:

$$V_{EVDa} + a V_{EVDc} = 3*V_{2EVD} \quad \text{[Eqn. 34]},$$

Rewriting Eqn. 34 in the complex domain and solving for real and imaginary parts yields:

$$FSI_C = |V_{EVDc}| = 3*|V_{2EVD}| * \frac{\sin(\varphi_{fa} - \angle V_{2EVD})}{\sin(\varphi_{fa} - \varphi_{fc} - 120)} \quad \text{[Eqn. 35]}$$

$$FSI_A = |V_{EVDa}| = 3*|V_{2EVD}| * \frac{\sin(\varphi_{fc} + 120 - \angle V_{2EVD})}{\sin(\varphi_{fc} + 120 - \varphi_{fa})}.$$

Eqn. 35 thus enables the FSI to be resolved along multiple axes—Phases C and A—to quantify an amount of EVD in each of the phases to which the EVD has been localized.

An example of an FSI phasor present on more than one phase of the electrical distribution system 10 is provided in FIG. 10—with the illustrated example showing an FSI phasor 84 present on Phases A and B of the electrical distribution circuit. The magnitude of the FSI phasor indicates an amount of the EVD, with the particular angle of the FSI phasor 84 being resolved to quantify the amount of EVD in each of Phase A and B.

While examples are set forth above in which an EVD is localized to one or two phases, it is recognized that the EVD may be localized to all three phases of the distribution circuit. In cases where the EVD in each of the three phases varies greatly in severity, Eqn. 9 (for a delta connected motor) and Eqn. 26 (for a star connected motor) can be used to quantify the EVD in each phase—i.e., the negative sequence voltage can be analyzed. In cases where there is exactly equal (or approximately equal) EVD in all three phases, the EVD in each phase can be localized and quantified by using positive sequence equations according to:

$$(1-a^2)*V_{EVDa}+(a-1)*V_{EVDb}+(a^2-a)*V_{EVDc}=3*(V_1-V_{1M})$$ [Eqn. 36]

and $$V_{EVDa}+aV_{EVDb}+a^2V_{EVDc}=3*(V_1-V_{1M})$$ [Eqn. 37], for delta and star connected motors, respectively.

In each case, the positive sequence voltage at the motor terminals, $V_{1M}$, can be determined according to:

$$V_{1M}=Z_{11}*I_1+Z_{12}*I_2$$ [Eqn. 38], where $Z_{11}$ is the positive sequence impedance of the motor, $Z_{12}$ is the coupling impedance between the positive sequence voltage and the negative sequence current, $I_1$ is the positive sequence current, and $I_2$ is the negative sequence current.

Beneficially, embodiments of the invention thus provide a system and method for detecting, localizing and quantifying EVD faults in three-phase AC motor circuits by using the motor three-phase voltages and currents. As EVD in three-phase motor circuits leads to voltage unbalance at the motor terminals and consequent current unbalance, an EVD fault can be detected via the analysis and processing of measured three-phase voltages and currents. As a rule of thumb, a 1% voltage unbalance in supply could lead to 6-10% unbalance in motor current—and thus even small voltage drops in the range of 40-300 mV can lead to appreciable current unbalance leading to detection of the voltage drop, with the effects of noise factors like supply unbalance, motor faults and motor intrinsic unbalance being accounted for, such that an EVD fault can be accurately diagnosed. According to embodiments of the invention, the detected EVD fault can be localized and quantified in a single phase, two phases, or all three phases. Such detecting of the EVD faults, and the online monitoring of the electrical distribution circuit in general, can be performed from a location at the distribution circuit or at a location remote from the distribution circuit.

A technical contribution for the disclosed method and apparatus is that it provides for a processor-implemented technique for detecting, localizing and quantifying excess voltage drops in three-phase AC motor circuits.

Therefore, according to one embodiment of the present invention, an electrical distribution circuit includes an input connectable to an AC source, an output connectable to terminals of an electrical machine, the output configured to provide three-phase voltages and currents to the electrical machine, and a diagnostic system configured to detect an excess voltage drop (EVD) in the electrical distribution circuit, the diagnostic system comprising a processor that is programmed to receive measurements of the three-phase voltages and currents provided to the electrical machine, compute a negative sequence voltage from the three-phase voltages and currents, determine a localization reference phase angle for each phase based in part on the three-phase voltages and currents, and calculate an EVD in the electrical distribution circuit based on the negative sequence voltage and the localization reference phase angles.

According to another embodiment of the present invention, a method for detecting excess voltage drop (EVD) in an electrical distribution circuit includes measuring three-phase voltages and currents provided to an electrical machine in the electrical distribution circuit by way of voltage and current sensors and causing a diagnostic system to calculate a fault severity index (FSI) based on the measured three-phase voltages and currents, wherein causing the diagnostic system to calculate the FSI further includes receiving the measured three-phase voltages and currents provided to the terminals of the electrical machine, computing a positive, negative, and zero sequence voltage and sequence current from the three-phase voltages, determining a compensated negative sequence voltage from the negative sequence voltage component, determining a localization reference phase angle for each phase based in part on the three-phase currents, and calculating the fault severity index (FSI) in the electrical distribution circuit based on the compensated negative sequence voltage and the localization reference phase angles.

According to yet another embodiment of the present invention, a diagnostic system configured to detect an excess voltage drop (EVD) fault in an electrical distribution circuit is provided. The diagnostic system includes a processor programmed to receive three-phase voltages and currents provided to terminals of an electrical machine connected to the electrical distribution circuit, compute positive sequence, negative sequence, and zero sequence voltage and current from the three-phase voltages and currents, determine a compensated negative sequence voltage from the negative sequence voltage component, determine a localization reference phasor for each phase based in part on the three-phase currents, identify an EVD fault in the electrical distribution circuit based on the compensated negative sequence voltage, and localize the EVD fault to one or more phases in the three-phase output based on a difference between a phase angle of the compensated negative sequence voltage and the localization reference phasors.

The present invention has been described in terms of the preferred embodiment, and it is recognized that equivalents, alternatives, and modifications, aside from those expressly stated, are possible and within the scope of the appending claims.

What is claimed is:

1. An electrical distribution circuit comprising:
an input connectable to an AC source;
an output connectable to terminals of an electrical machine, the output configured to provide three-phase voltages and currents to the electrical machine; and
a diagnostic system configured to detect an excess voltage drop (EVD) in the electrical distribution circuit, the diagnostic system comprising a processor that is programmed to:
receive measurements of the three-phase voltages and currents provided to the electrical machine;
compute a negative sequence voltage from the three-phase voltages and currents;
determine a localization reference phase angle for each phase based in part on the three-phase voltages and currents; and calculate an EVD in the electrical distribution circuit based on the negative sequence voltage and the localization reference phase angles.

2. The electrical distribution circuit of claim 1 wherein the EVD comprises a magnitude indicating an amount of EVD in the electrical distribution circuit and an angle indicating the phase or phases in the electrical distribution circuit in which the EVD is present.

3. The electrical distribution circuit of claim 1 wherein the processor is further programmed to estimate a compensated negative sequence voltage based on the negative sequence voltage and a motor terminal negative sequence voltage.

4. The electrical distribution circuit of claim 3 wherein the processor is further programmed to:
  compare the compensated negative sequence voltage to a voltage threshold; and
  if the compensated negative sequence voltage is greater than the voltage threshold, then identify the compensated negative sequence voltage as an EVD in the electrical distribution circuit;
otherwise, determine that there is no EVD in the in the electrical distribution circuit.

5. The electrical distribution circuit of claim 3 wherein the electrical machine comprises a delta connected electrical machine, and wherein the processor is further programmed to calculate the EVD according to:

$$((1-a)*V_{EVDa}+(a^2-1)*V_{EVDb}+(a-a^2)*V_{EVDc})=3*V_{2EVD}$$

where $$a = 1\angle 120 = -0.5 + j\frac{\sqrt{3}}{2},$$

$V_{EVDa}$, $V_{EVDb}$, $V_{EVDc}$ are voltage drops in phase A, B, C respectively representing an EVD, and $V_{2EVD}$ is the compensated negative sequence voltage.

6. The electrical distribution circuit of claim 3 wherein the electrical machine comprises a star connected electrical machine, and wherein the processor is further programmed to calculate the EVD according to:

$$V_{EVDa}+a^2V_{EVDb}+aV_{EVDc}=3*V_{2EVD}$$

where $$a = 1\angle 120 = -0.5 + j\frac{\sqrt{3}}{2},$$

$V_{EVDa}$, $V_{EVDb}$, $V_{EVDc}$ are voltage drops in phase A, B, C respectively representing an EVD, and $V_{2EVD}$ is the compensated negative sequence voltage.

7. The electrical distribution circuit of claim 3 wherein the processor is further programmed to localize the EVD to one or more phases in the three-phase output, wherein localizing the EVD comprises:
  determine a phase angle of the compensated negative sequence voltage;
  compare the phase angle of the compensated negative sequence voltage to the localization reference phase angles for each phase; and
  localize the EVD fault to one of the phases if a difference between the phase angle of the compensated negative sequence voltage and one of the localization reference phase angles is within a pre-determined angular range.

8. The electrical distribution circuit of claim 7 wherein, if the difference between the phase angle of the compensated negative sequence voltage and one of the localization reference phase angles is not within the pre-determined angular range, the processor is further programmed to:
  localize the EVD to more than one phase; and
  quantify an amount of EVD in each of the more than one of phases to which the EVD has been localized.

9. The electrical distribution circuit of claim 7 wherein the pre-determined angular range is plus or minus 15 degrees.

10. The electrical distribution circuit of claim 1 wherein the processor is further programmed to determine fundamental components of the three-phase voltages and currents provided to the electrical machine, and wherein the negative sequence voltage and the localization reference angles are determined from the fundamental components.

11. The electrical distribution circuit of claim 1 further comprising one or more circuit components positioned between the input and the output configured to control the three-phase voltages and currents to the output, wherein the one or more circuit components comprise at least one of a breaker, contactor, fuse, disconnect, motor control center, soft-starter, or motor drive; and
  wherein the processor in the diagnostic system receives three-phase voltage and current data acquired by sensors integrated into one of the motor control center, the soft-starter, relay, breakers, or the motor drive.

12. A method for detecting excess voltage drop (EVD) in an electrical distribution circuit, the method comprising:
  measuring three-phase voltages and currents provided to an electrical machine in the electrical distribution circuit by way of voltage and current sensors;
  causing a diagnostic system to calculate a fault severity index (FSI) based on the measured three-phase voltages and currents, wherein causing the diagnostic system to calculate the FSI comprises:
    receiving the measured three-phase voltages and currents provided to the terminals of the electrical machine;
    computing a positive, negative, and zero sequence voltage and sequence current from the three-phase voltages;
    determining a compensated negative sequence voltage from the negative sequence voltage component;
    determining a localization reference phase angle for each phase based in part on the three-phase currents; and
    calculating the fault severity index (FSI) in the electrical distribution circuit based on the compensated negative sequence voltage and the localization reference phase angles.

13. The method of claim 12 wherein the FSI comprises a voltage phasor having a magnitude indicating an amount of EVD in the electrical distribution circuit and an angle indicating the phase or phases in the electrical distribution circuit in which the EVD is present.

14. The method of claim 13 wherein calculating the FSI further comprises localizing the EVD to one of a first phase, a second phase, and a third phase in the three-phase output or to a combination of the first, second and third phases, wherein localizing the EVD comprises:
  determining a phase angle of the compensated negative sequence voltage;
  comparing the phase angle of the compensated negative sequence voltage to the localization reference phase angle for each of the first phase, the second phase, and the third phase;

determining if a difference between the phase angle of the compensated negative sequence voltage and one of the localization reference phase angles for the first phase, the second phase, and the third phase is within a pre-determined angular range; and localizing the EVD to one of the first phase, the second phase, and the third phase if the difference between the phase angle of the compensated negative sequence voltage and one of the localization reference phase angles for the first phase, the second phase, and the third phase is within the pre-determined angular range.

15. The method of claim 14 wherein, if the difference between the phase angle of the compensated negative sequence voltage and one of the localization reference phase angles for the first phase, the second phase, and the third phase is not within the pre-determined angular range, localizing the EVD further comprises:

localizing the EVD to more than one of the first, second and third phases; and resolving the EVD along multiple axes to quantify an amount of EVD in each of the more than one of the first, second and third phases to which the EVD has been localized.

16. The method of claim 14 wherein the pre-determined angular range is plus or minus 15 degrees.

17. The method of claim 13 wherein the electrical machine comprises a delta connected electrical machine, and wherein the amount and angle of EVD in the electrical distribution circuit is described by:

$$((1-a)*V_{EVDa}+(a^2-1)*V_{EVDb}+(a-a^2)*V_{EVDc})=3*V_{2EVD}$$

where $$a = 1\angle 120 = -0.5 + j\frac{\sqrt{3}}{2}$$

(i.e., a unit vector at an angle of 120 degrees), $V_{EVDa}$, $V_{EVDb}$, $V_{EVDc}$ are voltage drops in phase A, B, C respectively representing an EVD, and $V_{2EVD}$ is the compensated negative sequence voltage.

18. The method of claim 13 wherein the electrical machine comprises a star connected electrical machine, and wherein the amount and angle of EVD in the electrical distribution circuit is described by:

$$V_{EVDa}+a^2 V_{EVDb}+a V_{EVDc}=3*V_{2EVD}$$

where $$a = 1\angle 120 = -0.5 + j\frac{\sqrt{3}}{2}$$

(i.e., a unit vector at an angle of 120 degrees), $V_{EVDa}$, $V_{EVDb}$, $V_{EVDc}$ are voltage drops in phase A, B, C respectively representing an EVD, and $V_{2EVD}$ is the compensated negative sequence voltage.

19. A diagnostic system configured to detect an excess voltage drop (EVD) fault in an electrical distribution circuit, the diagnostic system comprising:

a processor programmed to:
receive three-phase voltages and currents provided to terminals of an electrical machine connected to the electrical distribution circuit;
compute positive sequence, negative sequence, and zero sequence voltage and current from the three-phase voltages and currents;
determine a compensated negative sequence voltage from the negative sequence voltage component;
determine a localization reference phasor for each phase based in part on the three-phase currents;
identify an EVD fault in the electrical distribution circuit based on the compensated negative sequence voltage; and
localize the EVD fault to one or more phases in the three-phase output based on a difference between a phase angle of the compensated negative sequence voltage and the localization reference phasors.

20. The diagnostic system of claim 19 wherein, in localizing the EVD fault, the processor is further programmed to:
determine the phase angle of the compensated negative sequence voltage;
compare the phase angle of the compensated negative sequence voltage to an angle of each negative sequence current reference phasor for each phase; and
localize the EVD fault to one of the phases if an angular difference between the phase angle of the compensated negative sequence voltage and one of the negative sequence current reference phasors is 15 degrees or less;
otherwise, if the angular difference is greater than 15 degrees, then localize the EVD to more than one phase, with an amount of EVD in each of the more than one of phases to which the EVD has been localized being separately quantified.

* * * * *